United States Patent
Wang et al.

(10) Patent No.: US 7,405,937 B1
(45) Date of Patent: Jul. 29, 2008

(54) HEAT SINK MODULE FOR DUAL HEAT SOURCES

(75) Inventors: Feng-Ku Wang, Taipei (TW); Chih-Kai Yang, Taipei (TW); Huang-Cheng Ke, Taipei (TW)

(73) Assignee: Inventec Corporation, Taipei (TW)

( * ) Notice: Subject to any disclaimer, the term of this patent is extended or adjusted under 35 U.S.C. 154(b) by 44 days.

(21) Appl. No.: 11/707,511

(22) Filed: Feb. 16, 2007

(51) Int. Cl.
  *H05K 7/20* (2006.01)
  *H01L 23/34* (2006.01)
  *F28F 7/00* (2006.01)

(52) U.S. Cl. .......... 361/700; 165/80.3; 165/104.33; 165/121; 257/719; 361/704; 361/710; 361/719

(58) Field of Classification Search .......... 361/687, 361/700, 719–720
See application file for complete search history.

(56) References Cited

U.S. PATENT DOCUMENTS

| | | | |
|---|---|---|---|
| 6,366,460 B1 * | 4/2002 | Stone et al. | 361/687 |
| 6,373,700 B1 * | 4/2002 | Wang | 361/698 |
| 6,407,921 B1 * | 6/2002 | Nakamura et al. | 361/700 |
| 6,504,720 B2 * | 1/2003 | Furuya | 361/699 |
| 6,654,245 B2 | 11/2003 | Kawashima et al. | |
| 6,708,754 B2 * | 3/2004 | Wei | 165/46 |
| 6,754,077 B2 * | 6/2004 | Lo et al. | 361/700 |
| 6,966,363 B2 * | 11/2005 | Gailus et al. | 165/185 |
| 7,120,018 B2 | 10/2006 | Shen et al. | |
| 7,133,287 B2 * | 11/2006 | Campini et al. | 361/719 |
| 7,339,787 B2 * | 3/2008 | Cheng et al. | 361/695 |
| 2004/0188080 A1 * | 9/2004 | Gailus et al. | 165/185 |
| 2004/0201958 A1 * | 10/2004 | Lev | 361/687 |
| 2007/0236887 A1 * | 10/2007 | Cheng et al. | 361/700 |

* cited by examiner

*Primary Examiner*—Gregory D Thompson
(74) *Attorney, Agent, or Firm*—Morris Manning Martin LLP; Tim Tingkang Xia, Esq.

(57) ABSTRACT

A heatsink module for dual heat sources for dissipating heat generated by a first and a second heat-generating element disposed on a circuit board is provided. The heatsink module includes a first heat-conducting plate, a second heat-conducting plate, a fixing member, a heat pipe, and a pressing flat spring. The first and second heat-conducting plates contact the first and second heat-generating elements respectively. The fixing member when fixed to the circuit board presses the second heat-conducting plate against the second heat-generating element. One end of the pressing flat spring is under the traction of the fixing member fixed to the circuit board, and presses the first heat-conducting plate against the first heat-generating element. The fixing member and the first heat-conducting plate then clamp the heat pipe, so as to conduct the heat generated by the first and second heat-generating elements to the heat pipe via the connecting elements.

11 Claims, 3 Drawing Sheets

HEAT SINK MODULE FOR DUAL HEAT SOURCES

BACKGROUND OF THE INVENTION

1. Field of Invention

The present invention relates to a heatsink module structure, and more particularly to a structure of a heatsink module for dual heat sources.

2. Related Art

Generally speaking, a conventional heatsink module installed in a computer is specially designed to dissipate the heat generated by central processing unit (CPU) which generates the most heat. Moreover, the necessary elements including housing, fan, and heat pipe are often modularized for the convenience of manufacturing and installation. For example, U.S. Pat. No. 6,373,700 and U.S. Pat. No. 6,654,245 both adopt the above structure.

Though the modularized heatsink devices disclosed in the above patents have good heat dissipation efficiency, they are designed to enhance the heat dissipation efficiency for the CPU. Therefore, even if the heat dissipation efficiency is enhanced, the heat generated by other heat-generating chips on a same circuit board cannot be dissipated directly, resulting in the situation that though the efficiency of the heatsink modules is good, the overall efficiency of computers with the heatsink modules cannot be increased effectively.

In order to solve the aforementioned problem, U.S. Pat. No. 7,120,018 further assembles a fan on heatsink fins mounted on a CPU. When the fan operates, the air is guided from an axial direction to a radial direction, and is blown to a northbridge chip near the CPU. A ventilation-enhancing member is assembled beside the northbridge chip to guide the air flow passing by the northbridge chip to other high heat-generating electronic components. Thus, an air flow path for conducting heat is formed, and the overall heat dissipation of all high heat-generating electronic components is achieved through the air flow path. However, when the above niethod of dissipating heat from various heat-generating electronic components through the air flow path is used, only the CPU that adopts the heatsink fins together with the fan has high heat dissipation efficiency. As the air flow passing by the CPU is of a high temperature, other high heat-generating electronic components disposed along the air flow path have low heat dissipation efficiency by means of blowing the high temperature air over the electronic components, and the problem of overall heat dissipation efficiency cannot be solved effectively.

SUMMARY OF THE INVENTION

In view of the above problem, the present invention is directed to providing a heatsink module for dual heat sources, so as to dissipate heat of two heat sources simultaneously.

Accordingly, the present invention discloses a heatsink module for dual heat sources, so as to dissipate heat generated by a first heat-generating element and a second heat-generating element. The first and the second heat-generating elements are disposed on a circuit board. The heatsink module for dual heat sources comprises a first heat plate, a second heat-conducting plate, a fixing member, a heat pipe, and a pressing flat spring.

The first heat-conducting plate contacts a surface of the first heat-generating element for conducing heat generated by the first heat-generating element to the first heat-conducting plate, and the first heat-conducting plate has a first claw portion. The second heat-conducting plate contacts a surface of the second heat-generating element for conducing heat generated by the second heat-generating element to the second heat-conducting plate. The fixing member has a second claw portion. The fixing member is fixed to a circuit board, and presses the second heat-conducting plate against the second heat-generating element, so as to conduct the heat of the second heat-conducting plate to the fixing member. One end of the heat pipe is clamped by the first claw portion and the second claw portion, so as to conduct the heat of the first heat-conducting plate and the fixing member to the other end of the heat pipe. The pressing flat spring has a pressing portion, and the pressing flat spring is under the traction of the fixing member fixed to the circuit board, such that the pressing portion is pressed against the first heat-conducting plate and the first heat-conducting plate is pressed against the first heat-generating element.

The other side of the pressing flat spring corresponding to the fixing member is screw onto the circuit board, and the pressing portion has a first slot, such that the first claw portion of the first heat-conducting plate passes through the first slot and clamps the heat pipe. One end of the pressing flat spring under the traction of the fixing member is fixed to one side of the fixing member.

The heatsink module for dual heat sources further comprises a fan and a heat-conducting element. The heat-conducting element is fixed on one side of the fan, and the heat-conducting element is connected with the heat pipe, so as to conduct the heat of the heat pipe to the heat-conducting element. The air generated when the fan operates flows to pass by the heat-conducting element, so as to dissipate the heat of the heat-conducting element.

To sum up, according to the heatsink module for dual heat sources of the present invention, when the fixing member is fixed to the circuit board, not only the second heat-conducting plate is directly pressed against the second heat-generating element by the fixing member, but also the pressing flat spring is also under the traction of the fixing member to press the first heat-conducting plate against the first heat-generating element. Thus, it is ensured that the first heat-conducting plate and the second heat-conducting plate are contacted with the first heat-generating element and the second heat-generating element respectively, so as to achieve the maximum heat dissipation efficiency.

The features and examples of the present invention will be illustrated in detail in preferred embodiments with reference to the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1:
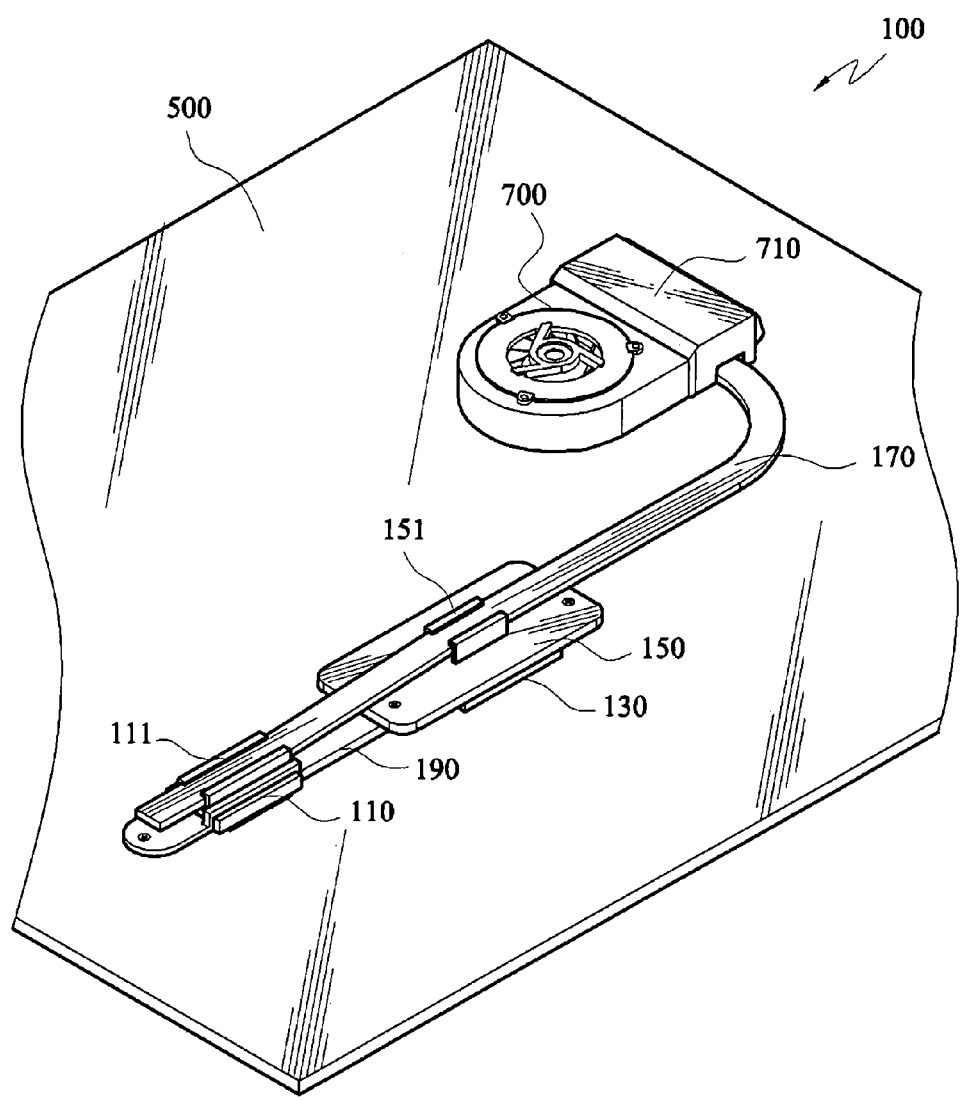
FIG. 1 is a schematic view of the present invention.
Figure 2:
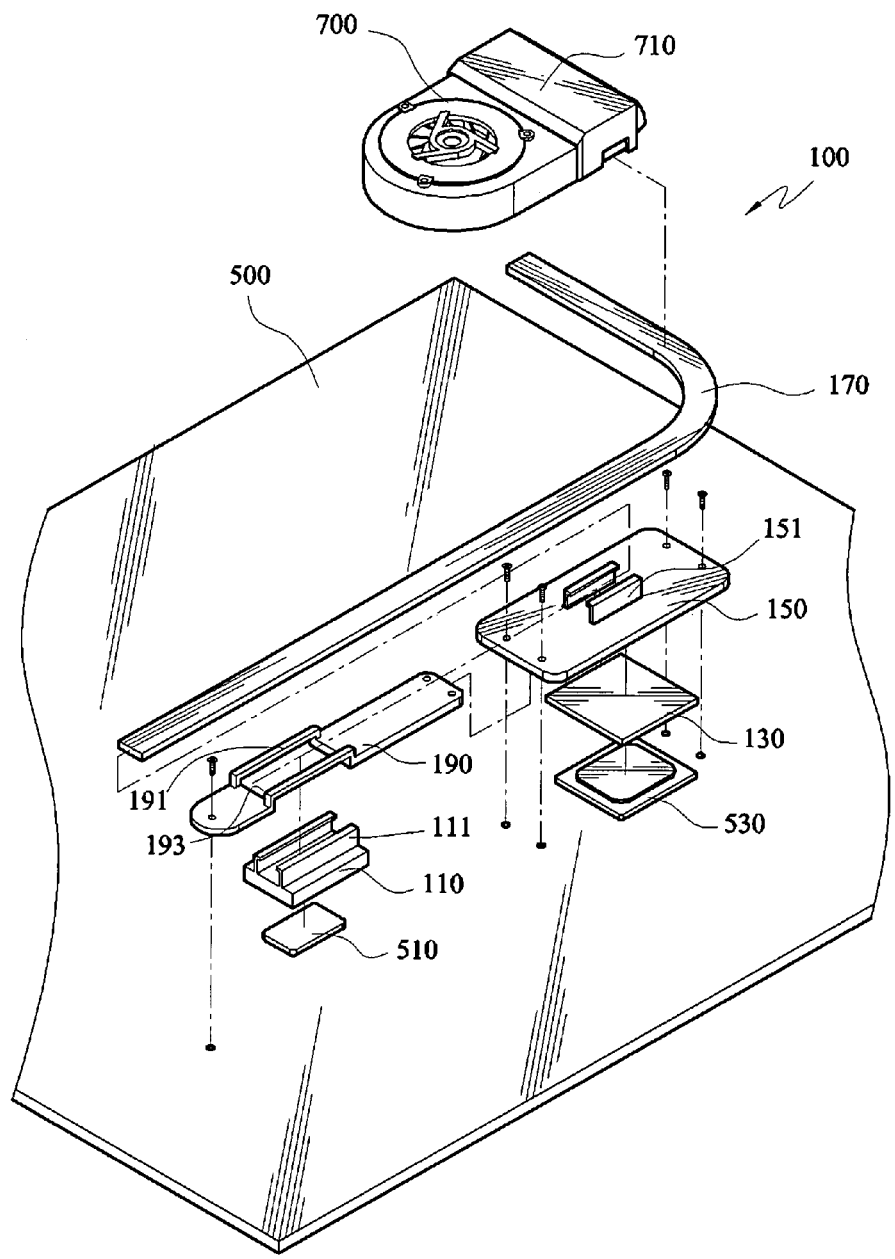
FIG. 2 is an exploded view of the present invention.

FIGS. 1 and 2 are a schematic view and a schematic exploded view of the present invention respectively. As shown in FIGS. 1 and 2, a heatsink module for dual heat sources 100 of the present invention is fixed onto a circuit board 500. A first heat-generating element 510 and a second heat-generating element 530 are disposed on the circuit board 500. When being fixed to the circuit board 500, the heatsink module for dual heat sources 100 dissipates the heat generated by the first heat-generating element 510 and the second heat-generating element 530. The circuit board 500 can be a mainboard. Therefore, the first heat-generating element 510 and the second heat-generating 530 can be a combination of a central processing unit (CPU) and a northbridge chip.

The heatsink module for dual heat sources 100 includes a first heat-conducting plate 110, a second heat-conducting plate 130, a fixing member 150, a heat pipe 170, and a pressing flat spring 190.

The first heat-conducting plate 110 contacts the surface of the first heat-generating element 510 for conducting the heat generated by the first heat-generating element 510 to the first heat-conducting plate 110. A first claw portion 111 is disposed on the other side corresponding to the first heat-generating element 510 of the first heat-conducting plate 110. The first claw portion 111 can be rail-shaped, and the width of the rail-shaped claw portion 111 is substantially equal to the width of the heat pipe 170. First, the first heat-conducting plate 110 can be fixed on the surface of the first heat-generating element 510 by means of adhesion.

The second heat-conducting plate 130 contacts the surface of the second heat-generating element 530, so as to conduct the heat generated by the second heat-generating element 530 to the second heat-conducting plate 130. The fixing member 150 is fixed to the circuit board 500. For example, the fixing member 150 is screwed onto the circuit board 500, and presses the second heat-conducting plate 130 against the second heat-generating element 530, so as to conduct the heat of the second heat-conducting plate 130 to the fixing member 150. The other side corresponding to the second heat-conducting plate 130 of the fixing member 150 extends to form a second claw portion 151. The second claw portion 151 is rail-shaped, and the width of the second claw portion 151 is substantially equal to the width of the heat pipe 170.

One end of the heat pipe 170 passes through the second claw portion 151 and the first claw portion 111 sequentially, and is clamped by the second claw portion 151 and the first claw portion 111, such that the end of the heat pipe 170 is fixed to the fixing member 150 and the first heat-conducting plate 110, so as to conduct the heat of the first heat-conducting plate 110 and the fixing member 150 to the other end of the heat pipe 170.

The pressing flat spring 190 has a pressing portion 191. One end of the pressing flat spring 190 is fixed to the circuit board 500, and the other end is fixed below the fixing member 150. Therefore, when the fixing member 150 is locked to the circuit board 500, the pressing portion 191 of the pressing flat spring 190 under the traction of the fixing member 150 is pressed against the first heat-conducting plate 110, such that the first heat-conducting plate 110 is pressed against the first heat-generating element 510. With the design of the traction structure described above, the pressing flat spring 190 applies a high pressing force to the first heat-conducting plate 110 and the first heat-generating element 510, such that the first heat-conducting plate 110 is in close contact with the first heat-generating element 510, ensuring that the heat generated by the first heat-generating element 510 is conducted to the first heat-conducting plate 110.

The end of the pressing flat spring 190 under the traction of the fixing member 150 can be screwed, riveted, or adhered to one side of the fixing member 150. A first slot 193 is opened in the portion corresponding to the first claw portion 111 of the pressing portion 191, such that the first claw portion 111 passes through the first slot 193 to clamp the heat pipe 170. The pressing portion 191 is protruded, so as to form an accommodation space for the first heat-conducting plate 110 to be embedded the pressing portion 191 that forms the accommodation space.

In addition, the heatsink module for dual heat sources 100 of the present invention further includes a fan 700 and a heat-conducting element 710. The heat-conducting element 710 is fixed on one side of the fan 700, and the heat-conducting element 710 is connected to the other side without clamped by the first claw portion 111 and the second claw portion 151 of the heat pipe 170, so as to conduct the heat of the heat pipe 170 to the heat-conducting element 710. The air generated when the fan 700 operates flows and passes through the heat-conducting element 710, and is exhausted to the outside, so as to dissipate the heat of the heat-conducting element 710.

Figure 3:
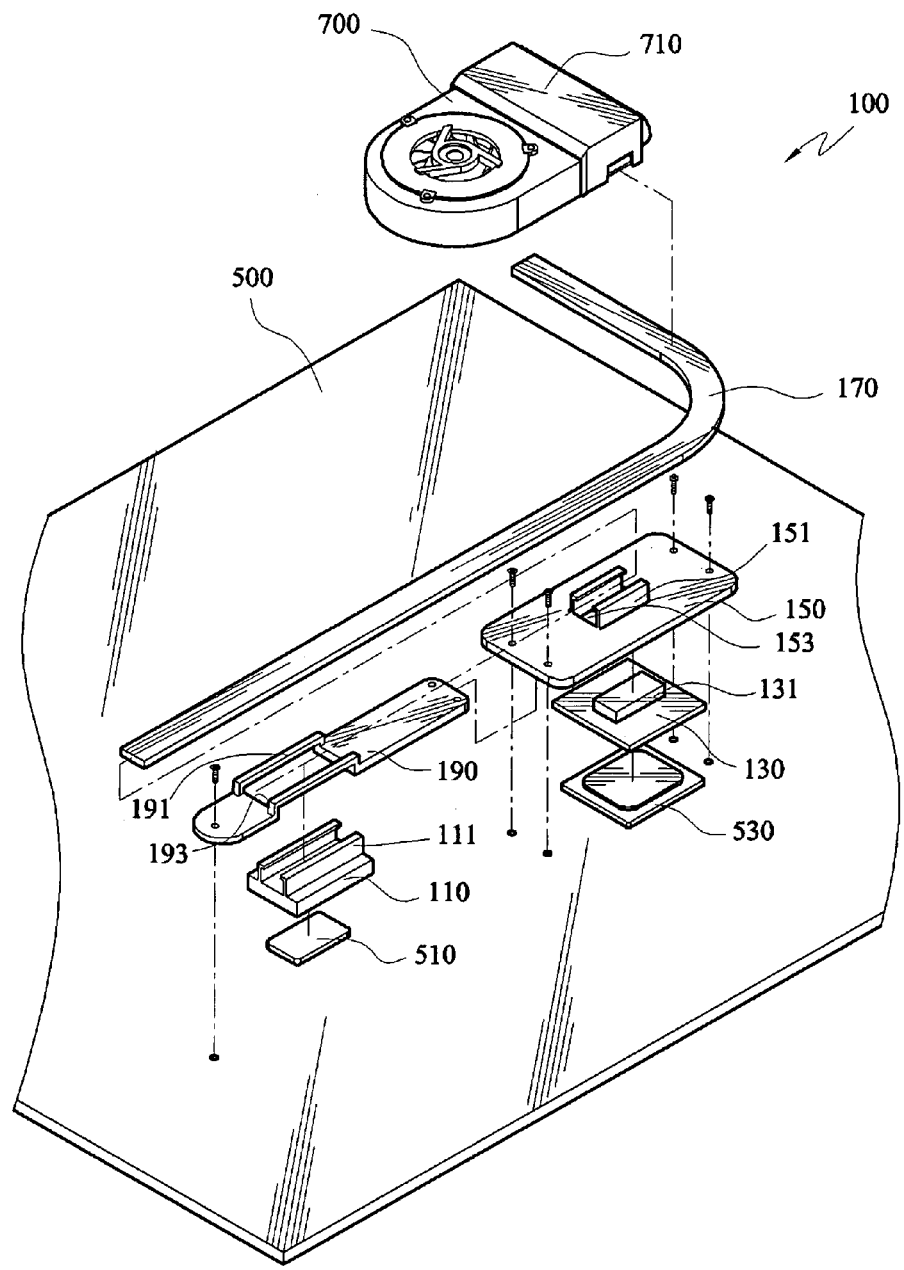
FIG. 3 is an exploded view of another embodiment of the present invention.

FIG. 3 is a schematic exploded view of another embodiment of the present invention. As shown in FIG. 3, the structural combination of this embodiment is the same as that of the previous embodiment, and will not be described herein again. However, the difference between the two embodiments is that a second slot 153 is opened on the fixing member 150 at a position of the second claw portion 151, and a side corresponding to the second slot 153 of the second heat-conducting plate 130 extends to form a bump 131. The shape of the bump 131 matches with that of the second slot 153, so the bump 131 can be accommodated in the second slot 153, such that the bump 131 directly contacts the heat pipe 170, and a part of the second heat-conducting plate 130 directly contacts the heat pipe 170, thereby improving the heat dissipation efficiency.

Therefore, the heatsink module for dual heat sources of the present invention uses the fixing member and the pressing flat spring to ensure the contact of the heat pipe, the first heat-conducting plate, the second heat-conducting plate, the first heat source, and the second heat source. Thus, the maximum heat dissipation efficiency is achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heatsink module dissipating heat generated by a first heat-generating element and a second heat-generating element which are disposed on a circuit board, the heatsink module for dual heat sources comprising:

a first heat-conducting plate, contacting a surface of the first heat-generating element, for conducting heat generated by the first heat-generating element to the first heat-conducting plate, and the first heat-conducting plate having a first claw portion;

a second heat-conducting plate, contacting a surface of the second heat-generating element, for conducting heat generated by the second heat-generating element to the second heat-conducting plate;

a fixing member, having a second claw portion, wherein the fixing member is fixed to the circuit board, and presses the second heat-conducting plate against the second heat-generating element, so as to conduct heat of the second heat-conducting plate to the fixing member;

a heat pipe, with one end clamped by the first claw portion and the second claw portion, so as to conduct heat of the first heat-conducting plate and the fixing member to other end of the heat pipe; and a pressing flat spring, having a pressing portion, wherein one end of the pressing flat spring is fixed to the circuit board and other end is fixed to the fixing member, such that the pressing portion is pressed against the first heat-conducting plate, and the first heat-conducting plate is pressed against the first heat-generating element.

2. The heatsink module as claimed in claim 1, wherein an underside of the other end of the pressing flat spring corresponding to the fixing member is screwed to the circuit board.

3. The heatsink module as claimed in claim 1, wherein the pressing portion has a first slot corresponding to the first claw portion, such that the first claw portion passes through the first slot and clamps the heat pipe.

4. The heatsink module as claimed in claim 1, wherein the pressing portion is protruded for the first heat-conducting plate to be embedded in the pressing portion.

5. The heatsink module as claimed in claim 1, wherein the other end of the pressing flat spring under traction of the fixing member is fixed to one side of the fixing member.

6. The heatsink module as claimed in claim 1, wherein the first claw portion is rail-shaped, and a width of the rail-shaped first claw portion is substantially equal to a width of the heat pipe.

7. The heatsink module as claimed in claim 1, wherein the second claw portion is rail-shaped, and a width of the rail-shaped second claw portion is substantially equal to width of the heat pipe.

8. The heatsink module as claimed in claim 1, wherein a second slot is opened on the fixing member at a position of the second claw portion, a side corresponding to the second slot of the second heat-conducting plate has a bump, and the bump is embedded in the second slot, such that the bump directly contacts the heat pipe.

9. The heatsink module as claimed in claim 1, further comprising a fan and a heat-conducting element, wherein the heat-conducting element is fixed to the fan, and the heat-conducting element is connected with the heat pipe, so as to conduct heat of the heat pipe to the heat-conducting element, and the fan generates an air flow that passes by the heat-conducting element to dissipate heat of the heat-conducting element.

10. The heatsink module as claimed in claim 1, wherein the fixing member is fixed to the circuit board by a screw.

11. A heatsink module, for dissipating heat generated by a first heat-generating element and a second heat-generating element disposed on a circuit board, the heatsink module for dual heat sources comprising:

a first heat-conducting plate, contacting a surface of the first heat-generating element, for conducting heat generated by the first heat-generating element to the first heat-conducting plate, and the first heat-conducting plate having a first claw portion;

a second heat-conducting plate, contacting a surface of the second heat-generating element, for conducting heat generated by the second heat-generating element to the second heat-conducting plate;

a fixing member, having a second claw portion, wherein the fixing member is screwed to the circuit board, and presses the second heat-conducting plate against the second heat-generating element, so as to conduct heat of the second heat-conducting plate to the fixing member;

a heat pipe, with one end of the heat pipe clamped by the first claw portion and the second claw portion, so as to conduct heat of the first heat-conducting plate and the fixing member to other end of the heat pipe;

a pressing flat spring, having a pressing portion, wherein one end of the pressing flat spring is fixed to the circuit board, and other end is fixed to the fixing member, such that the pressing portion is pressed against the first heat-conducting plate, and further the first heat-conducting plate is pressed against the first heat-generating element, the pressing portion has a first slot corresponding to the first claw portion, such that the first claw portion passes through the first slot and clamps the heat pipe;

a fan, generating an air flow; and a heat-conducting element, fixed to the fan, and connected with the heat pipe to conduct heat of the heat pipe to the heat-conducting element, such that the air flow passes by the heat-conducting element to dissipate heat of the heat-conducting element;

wherein the fixing member has a second slot at a position corresponding to the second claw portion, a side of the second heat-conducting plate corresponding to the second slot has a bump, and the bump is clamped in the second slot, such that the bump directly contacts the heat pipe.

* * * * *